United States Patent
Schier et al.

(10) Patent No.: US 7,046,723 B2
(45) Date of Patent: May 16, 2006

(54) DIGITAL FILTER AND METHOD FOR PERFORMING A MULTIPLICATION BASED ON A LOOK-UP TABLE

(75) Inventors: Thorsten Schier, Kista (SE); Jonas Askeroth, Lyckeby (SE); Greger Sjoberg, Kariskrona (SE)

(73) Assignee: Nokia Corporation, Espoo (FI)

( * ) Notice: Subject to any disclaimer, the term of this patent is extended or adjusted under 35 U.S.C. 154(b) by 590 days.

(21) Appl. No.: 09/970,757

(22) Filed: Oct. 3, 2001

(65) Prior Publication Data

US 2002/0118739 A1 Aug. 29, 2002

Related U.S. Application Data

(63) Continuation of application No. PCT/EP99/02762, filed on Apr. 14, 1999.

(51) Int. Cl.
*A03K 5/159* (2006.01)
*H03H 7/30* (2006.01)
*G06F 15/00* (2006.01)
*G06F 17/14* (2006.01)

(52) U.S. Cl. .................. 375/229; 375/231; 708/316; 708/400

(58) Field of Classification Search ............. 375/229, 375/231; 708/203–625; 382/251
See application file for complete search history.

(56) References Cited

U.S. PATENT DOCUMENTS

| | | | | |
|---|---|---|---|---|
| 4,566,075 A | * | 1/1986 | Guttag | 708/620 |
| 5,117,385 A | * | 5/1992 | Gee | 708/625 |
| 5,255,216 A | * | 10/1993 | Blanz et al. | 708/625 |
| 5,453,945 A | * | 9/1995 | Tucker et al. | 708/400 |
| 5,457,644 A | * | 10/1995 | McCollum | 708/230 |

OTHER PUBLICATIONS

"Digital Filter with Dual–Table Look–Up Multiply"; IBM Technical Disclosure Bulletin, US, IBM Corporation, New York, vol. 36, No. 11, pp. 301–303.
A. Peled, R. Liu and K. Steiglitz; "A Note on Implementation of Digital Filters", IEEE Transactions on Audio and Electroacoustics, vol. 23, No. 4, Aug. 1975, pp. 387–389.
A. Tawfik, P. Agathoklis, and F. El–Guibaly; "New Low Roundoff Noise Realization of Second–Order Digital Filter Sections With Coefficients Which Are Sum Of Power–Of–Two", Proceedings of the Midwest Symposium On Circuits and Systems, New York, IEEE, vol. 36, pp. 272–275.
International Search Report for PCT/EP99/02762.

(Continued)

*Primary Examiner*—Amanda T. Le
*Assistant Examiner*—Cicely Ware
(74) *Attorney, Agent, or Firm*—Squire, Sanders & Dempsey LLP

(57) ABSTRACT

A digital and a multiplication method are described, which lead to an efficient architecture for a hardware implementation of digital FIR and IIR filters into FPGAs. The multiplications of input sample data and delayed sample data with filter coefficients are performed by addressing look-up tables in which corresponding multiplication results are prestored. The size of the look-up tables is reduced by storing only those multiplication results which cannot be obtained by a shifting operation performed on the other pre-stored multiplication results, the input sample data, or the delayed sample data. Thereby, the size of the look-up tables can be compressed significantly such that an implementation of large digital filters into FPGAs is possible.

11 Claims, 3 Drawing Sheets

OTHER PUBLICATIONS

The Role of Distributed Arithmetic in FPGA–based Signal Processing.

Digital Filter Design (Topics in Digital Signal Processing), T.W. Parks et al., 1987, pp. 140–142.

Chapter 7 "Implementation of Discrete–Time Systems", Digital Signal Processing: Principles, Algorithms, and Applications, Third Edition, by Proakis et al, 1996, pp. 521–526.

* cited by examiner

DIGITAL FILTER AND METHOD FOR PERFORMING A MULTIPLICATION BASED ON A LOOK-UP TABLE

CROSS-REFERENCE TO RELATED APPLICATIONS

This application is a continuation of PCT/EP99/02762, filed Apr. 14, 1999, the entire contents of which are incorporated herein by reference.

FIELD OF THE INVENTION

The present invention relates to a digital filter, such as an FIR (Finite Impulse Response) filter or an IIR (Infinite Impulse Response) filter, and a method for performing a multiplication based on a look-up table and used in such a digital filter.

BACKGROUND OF THE INVENTION

A digital filter structure usually comprises delay registers, multipliers and adders. In an IIR filter, these components are usually arranged in a feedback branch. Depending on the system requirements for digital filters, the number of required multiplication processings may vary drastically.

When implementing digital filters, it is desired and often necessary to reduce implementation costs as much as possible. The performance of the digital filter depends on the architectures used for implementation, i.e. DSP (Digital Signal Processor), ASIC (Application Specific Integrated Circuit) or FPGA (Field Programmable Gate Array).

FPGAs play an increasingly important role in digital signal processing systems. They are widely used both for smaller designs in commercial products and in larger prototypes used for system evaluations. Their advantage compared to ASICs is the fast implementation of a circuit design into a hardware arrangement and the low price at low volumes.

However, since the FPGA architecture sets constraints on the size of the design, it is required to keep the design as small as possible, such that the circuit can be implemented as an FPGA device. Moreover, the FPGA architecture sets constraints on the maximum clock frequency, such that additional implementation techniques have to be chosen for FPGAs in order to achieve high speed circuits.

A digital filter can be implemented as an FIR filter or as an IIR filter. According to the known structure of a digital FIR filter, sampled input data obtained from a filter input signal are delayed by a sampling period or a multiple thereof. The length or multiple of the maximum delay period in relation to the sample period used for generating the sampled input data defines the order of the digital filter. Each delayed sample data corresponding to a predetermined delay period is weighted by a corresponding filter coefficient which defines the type and shape of the filter.

Assuming an incoming data x(n) filtered by a filter having the coefficients $b_0, b_1, \ldots, b_K$, the output data is expressed by the following equation (1):

$$y(n) = \sum_{i=0}^{K} b_i x(n-i) \quad (1)$$

Thus, (K+1) multiplications and K additions are necessary in order to calculate the output signal y(n), such that a large chip area and a high power consumption is required.

A known approach to reduce the required chip size is to use a time-shared multiplication processing. Therein, the input data x(n) is propagated through a delay line and the filter coefficients $b_i$ are stored in a memory. Then, the corresponding delayed input values x(n−i) and $b_i$ are successively multiplied with each other in a time serial manner and the results are accumulated in an accumulator. Thus, only one multiplier is required for the whole digital filter processing. However, this approach requires a multiplication processing which has to be carried out much faster than the arrival of the data at the filter input. Thus, in case of high data speed applications, problems arise due to the physical limitations of the devices. Consequently, the implementation of a time-shared multiplier may not be feasible.

Furthermore, FIR filters can be implemented in an efficient manner into an FPGA architecture using the so-called distributed arithmetics (DA) approach.

In this case, the multiplication is actually not carried out, but the result is looked up in a ROM look-up table used for storing the results of the multiplications. In DA filters, the input signal is represented in binary form in the 2's complement which is represented by the following equation (2):

$$x(n-i) = -x_0(n-i) + \sum_{b=1}^{B-1} x_b(n-i) \cdot 2^{-b} \quad (2)$$

Wherein $x_b(n-i)$ denotes a binary variable and b the bit position of the binary variable within the input data x(n−i).

If this equation (2) is inserted into the equation (1) the output signal is expressed as follows:

$$y(n) = -\sum_{i=1}^{K} x_0(n-i)b_i + \sum_{i=1}^{K}\sum_{b=1}^{B-1} x_b(n-i)b_i 2^{-b} = -[x_0(n-1)A_1 + \quad (3)$$

$$x_0(n-2)A_2 + x_0(n-3)A_3 + \ldots + x_0(n-K)A_K] + [x_1(n-1)A_1 +$$

$$x_1(n-2)A_2 + x_1(n-3)A_3 + \ldots + x_1(n-K)A_K]2^{-1} +$$

$$[x_2(n-1)A_1 + x_2(n-2)A_2 + x_2(n-3)A_3 + \ldots +$$

$$x_2(n-K)A_K]2^{-2} + [x_3(n-1)A_1 + x_3(n-2)A_2 +$$

$$x_3(n-3)A_3 + \ldots + x_3(n-K)A_K]2^{-3}$$

$$\vdots +$$

$$[x_{B-1}(n-1)A_1 + x_{B-1}(n-2)A_2 + x_{B-1}(n-3)A_3 + \ldots +$$

$$x_{B-1}(n-K)A_K]2^{-(B-1)}$$

In the above equation, each row describes a multiplication of all coefficients with all bits at a certain bit position i.e. in row number zero, all least significant bits are multiplied with the corresponding coefficients, and in row B-1, all most significant bits are multiplied with the corresponding coefficients.

After these multiplications have been carried out, the final result is obtained by weighting the rows with the corresponding bit position, and adding all weighted rows together.

However, this prior art solution leads to the following drawbacks:

a) The look-up tables are all identical, and the size of the look-up tables increases exponentially with an increase in the bit number of the input data.

b) The shift operation provided for the final weighting of the different bit positions introduces a latency into the digital filter. This latency is often unacceptable for feedback systems, i.e. IIR filters, since those systems will not work if the input data arrives faster than the end of processing of the previous data. Thus, in order to calculate y(n), the multiplication of x(n−1) with $b_1$ has to be finished before the next sample data x(n) arrives.

SUMMARY OF THE INVENTION

It is therefore an object of the present invention to provide a cost effective digital filter with low latency.

This object is achieved by a digital filter comprising:

delay means for delaying input sample data by predetermined delay periods to generate delayed input sample data;

look-up table means for pre-storing weighted sample data corresponding to multiplications of input sample data with predetermined filter coefficients, wherein said input sample data and said delayed input sample data are used for addressing said look-up table means; and bit shifting means for generating other weighted sample data corresponding to other multiplications of input sample data with predetermined filter coefficients by performing a bit shifting operation using said pre-stored weighted coefficients, wherein the values of said other weighted sample data correspond to the values of said pre-stored weighted sample data multiplied by two or a power of two.

Additionally, the above object is achieved by a method for performing digital filtering of input sample data, comprising the steps of:

delaying said input sample data by predetermined delay periods to generate delayed input sample data;

pre-storing weighted sample data corresponding multiplications of input sample data with predetermined filter coefficients; and generating other weighted input data corresponding to other multiplications of input sample data with predetermined filter coefficients by performing a bit shifting operation using said pre-stored weighted sample data, wherein the values of said other weighted sample data correspond to the values of said pre-stored weighted sample data multiplied by two or a power of two.

Furthermore, the above object is achieved by a method for performing a multiplication based on a look-up table, comprising the steps of:

obtaining those multiplication results, which correspond to a multiplier or multiplicand value which can be obtained by multiplying another multiplier or multiplicand value by a factor equal to two or a power of two by using the multiplication result corresponding to said another multiplier or multiplicand value and performing a corresponding bit shifting operation in accordance with said factor; and storing only those multiplication results in look-up tables which cannot be generated from another multiplication result by said bit shifting operation.

Accordingly, only one look-up table is required for each filter coefficient, since the input sample data are not split up into their bit positions. Additionally, the size of the look-up tables is reduced by storing only those weighted sample data which cannot be obtained from other weighted sample data by a bit shifting operation. Especially, in case the bit number of the input sample data increases and more filter coefficients are needed, the hardware implementation costs can be decreased substantially compared to the prior art, e.g. the DA implementation. Thus, even large filters can be implemented in FPGA architectures.

Moreover, since the input sample data is not divided into its bit positions, an additional shifting operation is not required after the multiplications and a low latency is introduced. Therefore, the digital filter architecture according to the present invention enables the use of an FPGA architecture in feedback systems like IIR filters or adaptive systems, where the latency of the filter is crucial factor. Having a FPGA architecture in such systems leads to a faster hardware implementation and enables initial testing in the laboratory.

Furthermore, also those weighted sample data which can be obtained from the input sample data by a bit shifting operation are preferably not stored in the look-up table means. Thereby, coefficients with a value equal to two or a power of two do not require a look-up table and their multiplications are simply implemented as a shifting operation, which leads to a further reduction of the required storing capacity of the look-up tables and hence the chip size.

Preferably, said other weighted sample data correspond to a filter coefficient the value of which can be obtained by multiplying another filter coefficient by a factor equal to two or a power of two, and are generated by performing a corresponding bit shifting operation with a corresponding one of said pre-stored weighted sample data relating to said another filter coefficient in accordance with the multiplication factor. Thus, look-up operations for predetermined filter coefficients can be performed by using look-up tables of other filter coefficients and performing a subsequent bit shifting operation.

Furthermore, the other weighted sample data may correspond to an input sample data the value of which can be obtained by multiplying another input sample data by a factor equal to two or a power of two, and may be generated by using a corresponding one of said pre-stored weighted sample data relating to the other sample data and performing a corresponding bit shifting operation in accordance with the multiplication factor. For many coefficients, this processing enables a reduction of the table size by approximately 50% for input signals with a high bit number. In case the pre-stored weighted sample data are stored in look-up tables each corresponding to one filter coefficient, an index table is provided for addressing the another input sample data, and a zero pad table indicating the number of bit shifting operations to be performed on the corresponding pre-stored weighted sample data relating to the another input sample data. Thereby, the original table containing the pre-stored multiplication results is exchanged with two smaller tables and one table containing a subset of the values stored in the original table. The table containing the subset of values has approximately only half the size of the original table. In view of the fact that the size of the original table increases in an exponential manner and the size of the exchanged smaller tables only in a linear manner, a considerable size reduction can be obtained for digital filters processing sample data with high bit numbers.

The method for reducing the size of the look-up tables can be used for generating any look-up table implementing a multiplication operation of a corresponding digital processing.

BRIEF DESCRIPTION OF THE DRAWINGS

In the following the present invention will be described in greater detail on the basis of a preferred embodiment with reference to the accompanying drawings, in which.

DESCRIPTION OF THE PREFERRED EMBODIMENT

In the following, the preferred embodiment of the digital filter and optimization method according to the present invention will be described on the basis of an FIR filter shown in FIG. 1.

Figure 1:
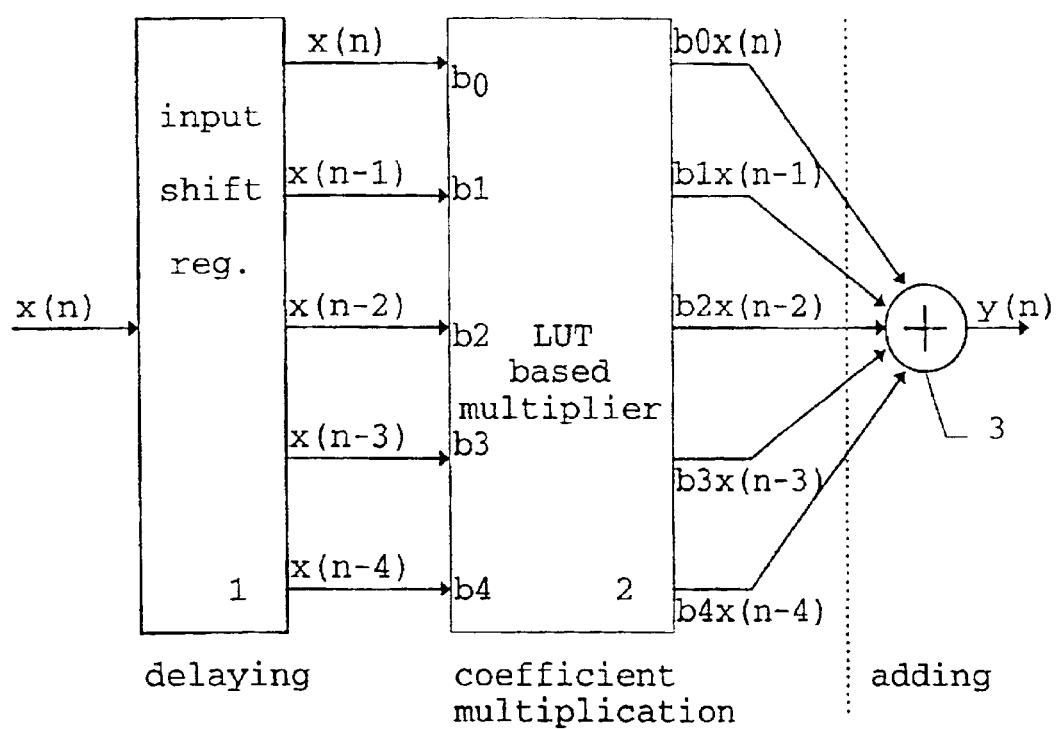
FIG. 1 shows a block diagram of an FIR filter according to the preferred embodiment the present invention.

According to FIG. 1, a sample data x(n) which may be obtained from an A/D converter (not shown) is applied to an input shift register 1 used for providing delayed sample data x(n−1) to x(n−4). The input sample data x(n) and the delayed input sample data x(n−1) to x(n−4) are supplied in parallel to corresponding address input terminals of a look-up table (LUT) based multiplier 2 which performs the multiplication of the input sample data with corresponding filter coefficients $b_0$ to $b_4$ based on one or a plurality of look-up tables.

Thus the input sample data are not split up into their bit positions, but are completely supplied to the LUT based multiplier 2 in order to address a look-up table corresponding to the respective filter coefficient and pre-storing results of multiplications, i.e. values of the weighted sample data, obtained by multiplying the input sample data by the respective filter coefficient. However, results of multiplications are only stored for those multiplications which cannot be performed on the basis of a bit shifting operation. If the multiplication can be performed as a bit shifting operation of the input sample data or other stored multiplication results, a corresponding bit shifting operation is performed in an additional processing unit, such as a shift register or an accumulator register. In the present case, the bit shifting processing unit is arranged in the LUT based multiplier 2. However, it may be arranged as a separate unit controlled by the LUT based multiplier 2.

At the output terminals of the LUT based multiplier 2, the weighted sample data (multiplication results) obtained by multiplying the input sample data or the delayed input sample data by the corresponding filter coefficients are output and supplied to an adder 3 arranged to add the weighted sample data in order to obtain the filter output data y(n).

As already mentioned, the number of look-up tables used in the LUT based multiplier 2 is reduced by considering the value of the respective filter coefficients and the relationship of a respective filter coefficient to other filter coefficients.

In case the filter coefficient $b_i$ has a value equal to two or a power of two, no look-up table is required at all for obtaining the weighted sample data, since the multiplication simply can be implemented as a bit shifting operation, i.e. a filter coefficient value 2 corresponds to a single bit shift to the left, a filter coefficient value 4 to two bit shift operations to the left, and so on.

Furthermore, if a respective filter coefficient $b_i$ has a relationship with another filter coefficient such that the value of the filter coefficient $b_i$ is obtained by multiplying the other filter coefficient by a factor equal to two or a power of two, the multiplication corresponding to the respective filter coefficient $b_i$ can be implemented by using the look-up table of the other filter coefficient and performing a shift operation defined by the factor defining the relationship between the two filter coefficients. Thus, it is not necessary to provide look-up tables for both filter coefficients in the filter. When a filter coefficient of e.g. the value 6 is used, it is sufficient to implement a look-up table for the value 3 and perform a subsequent bit shifting operation. Thereby, one column of the look-up table is saved. It is to be noted that, in the above case, the value 3 does not necessarily has to be an actual coefficient of the filter.

Figure 2:
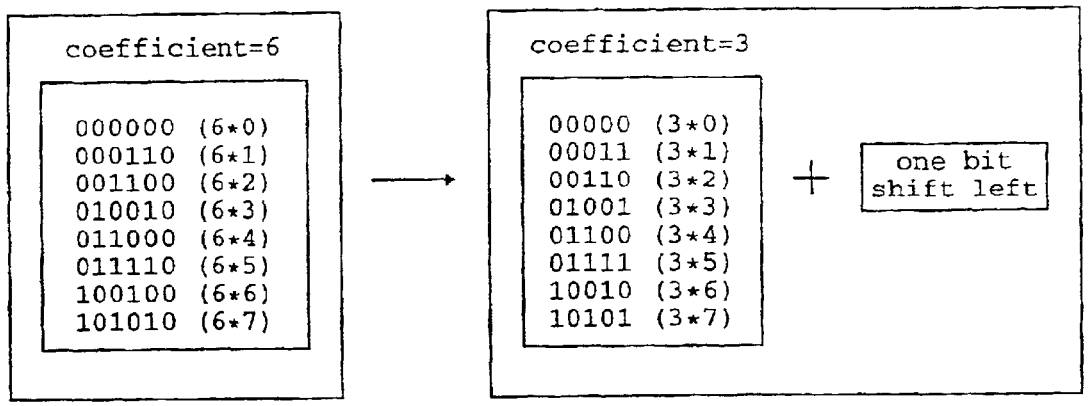
FIG. 2 shows a diagram used for explaining a reduction of the size of a look-up table according to the preferred embodiment of the present invention.

FIG. 2 shows an example for a filter coefficient $b_i$=6. In this case, the filter coefficient $b_i$ can be obtained by multiplying a filter coefficient $b_j$=3 by the value 2 which corresponds to a single bit shift to the left. Thus, as shown in FIG. 2, the look-up table (multiplication results) relating to the filter coefficient $b_i$=6 can be obtained from the look-up table (multiplication results) relating to the filter coefficient $b_j$=3 by shifting the values of the latter look-up table one bit to the left. For reasons of simplicity, the input sample data range has been restricted in FIG. 2 to the values 0 to 7.

Thus, assuming that the implemented FIR filter contains the coefficients $b_i$=6 and $b_j$=3, only one look-up table has to be implemented for the filter coefficient $b_j$=3, and the multiplication with the filter coefficient $b_i$=6 can be performed by using the look-up table relating to the filter coefficient $b_j$=3 and controlling the bit shifting processing means so as to perform a bit shifting operation of one position to the left, which corresponds to a multiplication by the value 2.

The above described optimization can be applied to any filter coefficient value that can be described as follows:

$$h(n)=r(n)\cdot 2^z \qquad (4)$$

wherein h(n) denotes the original coefficient value, r(n) the coefficient value to which the look-up table to be stored in the multiplier 2 relates, and z the number of bit shifting operations to the left.

Besides the above described reduction of the number of look-up tables required in the LUT based multiplier 2, the size of the remaining look-up tables can be reduced by the following optimization according to which relationships between the look-up table values are considered. In particular, those look-up table values which can be obtained from other look-up table values relating to the same filter coefficient by a shifting operation are not stored in the look-up table. Thereby, the table size of a look-up table relating to a filter coefficient approximately can be reduced by 50% for input sample data with high bit numbers.

According to the above table optimization, the original look-up table containing the results of the multiplication is exchanged with two smaller tables and one table containing a subset of values stored in the original table. The table containing the subset of values is reduced to half the size of the original table.

Figure 3:
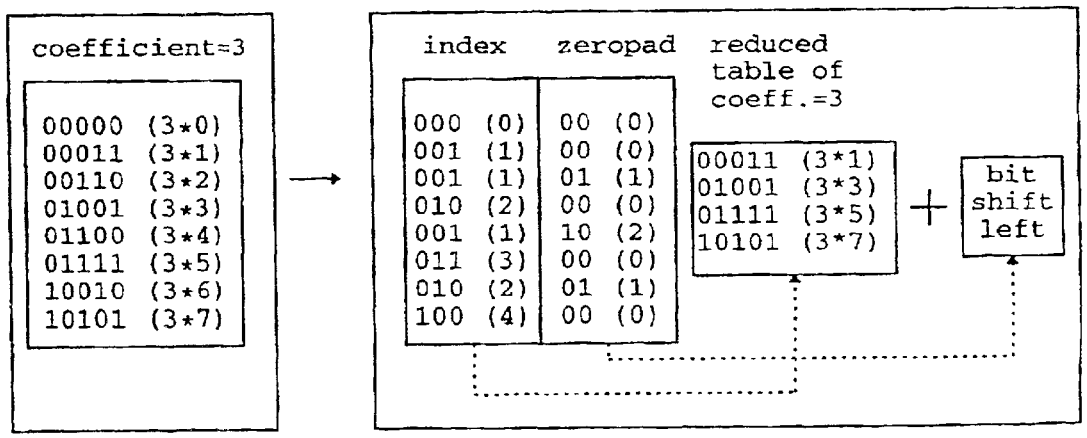
FIG. 3 shows a diagram used for explaining a further reduction of the size of a look-up table according to the preferred embodiment of the present invention.

FIG. 3 shows an example for the above described optimization based on the look-up table for the filter coefficient $b_j$=3. The look-up table on the left-hand side of FIG. 3 is the original look-up table. For reasons of simplicity, the range of the input data samples is again reduced to the values 0 to 7. This optimization method uses the fact that e.g. the multiplication of an input sample data having the value 4 with the respective filter coefficient can be expressed as two times the multiplication of an incoming signal having the value 1 with the value 2 and a subsequent multiplication of the result with the filter coefficient, i.e. 4·$b_i$=1·2·2·$b_i$. Hence, only the result for the incoming signal of the value 1 has to be stored and the results for the incoming signals with the value 2, 4, 8, . . . can be generated therefrom. This reduction is possible for all input sample data values which can be obtained by multiplying another sample data by a factor equal to two or a power of two, wherein the factor defines the number of bit shifting operations required for generating the corresponding multiplication result.

As an example, an input sample data having the value 4 is considered. In the left-hand table of FIG. 3, the fifth row includes the look-up table value for the multiplication of the filter coefficient $b_j$=3 by the input sample data value 4. As shown by the right-hand tables of FIG. 3, the original look-up table is divided into an index table indicating, at its corresponding row, the row number of the reduced subset table shown on the right. Furthermore, the original look-up table is split into a zero pad table indicating, at its corresponding row, the number of bit shift operations required to obtain the corresponding multiplication result from the value of the reduced look-up table indicated by the index table. In the above case of the sample data value 4, an index value 1 is shown in the fifth row of the index table and a zero pad value 2 is shown in the fifth row of the zero pad table. Thus, the value of the first row of the reduced subset table, i.e. the value 1, will be used and shifted by two bit positions to the left, i.e. two multiplications by the value 2. Thereby, the required multiplication value is obtained. It is to be noted that the indices of the left hand coefficient table and the reduced right hand coefficient table are different, i.e. left side 0–7 and right side 1–4.

As can be gathered from FIG. 3, the above optimization processing only leads to size reductions, when the bit number of the used sample data is high. The reason therefore is that the size of the original look-up table increases in an exponential manner with the bit number, whereas the size of the index and zero pad table increases in a linear manner with the bit number.

The following equations can be derived in case the above compression is performed for all possible input data sample values:

$$Ts_{original} = \left(\sum_{n=1}^{N} w(n)\right) \cdot 2^{B-1} \qquad (5a)$$

$$Ts_{compressed} = \left(\sum_{n=1}^{N} w(n)\right) \cdot 2^{B-2} + B \cdot 2^{B-1} + (B-1) \cdot 2^{B-1} \qquad (5b)$$

wherein $Ts_{original}$ denotes the total number of bits without table compression, $Ts_{compressed}$ the total number of bits with table compression, B the number of bits of the input sample data, N the number of tables, and w the table width. The first term of the equation (5b) defines the total size of the reduced coefficient table, the second term the size of the index table, and the third term the size of the zero pad table. For large filters with high bit numbers of the sample data, the size of the reduced look-up tables converges to half of the original size, i.e. $Ts_{compressed} \rightarrow \frac{1}{2} \cdot Ts_{original}$.

Figure 4:
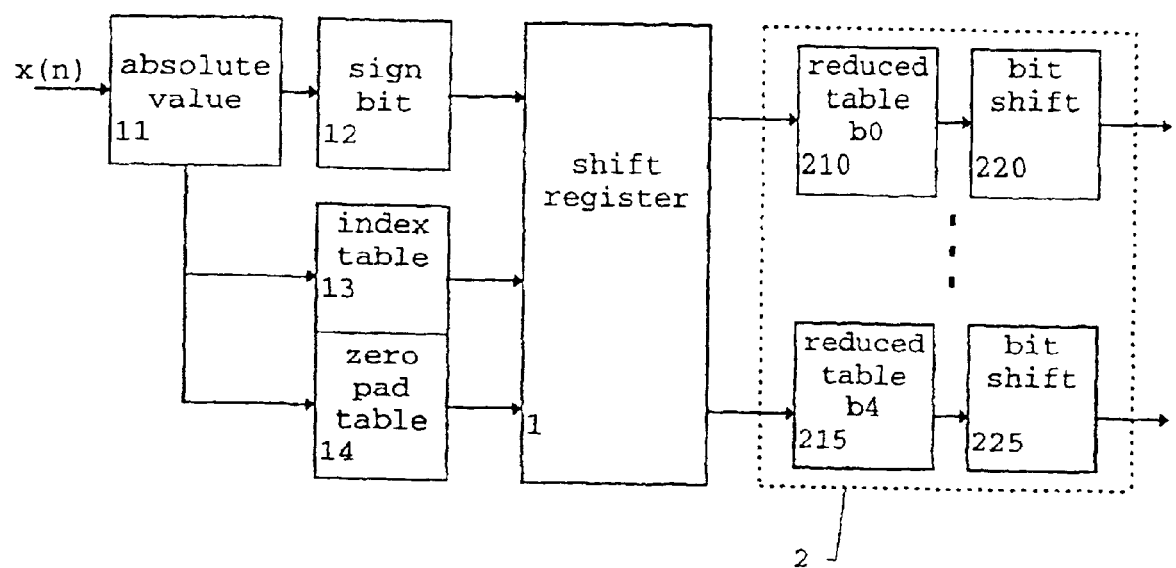
FIG. 4 shows a block diagram of a part of an implementation example of the preferred embodiment according to the present invention.

FIG. 4 shows a block diagram of an example of an implementation of the preferred embodiment according to FIG. 1, wherein the above optimization shown in FIG. 3 is implemented.

According to FIG. 4, the input sample data x(n) is supplied to a processing unit 11 arranged to calculate an absolute value of the input sample data x(n), wherein the sign bit is supplied to and stored in a sign bit memory unit 12. The calculated absolute value is supplied to an address inputs of an index table 13 and a zero pad table 14. Based on the addressing by the absolute value supplied to the address inputs, the index table 13 and the zero pad table 14 output corresponding stored index values and stored bit shifting values, respectively, to the shift register 1. Additionally, the sign bit stored in the sign bit memory unit 12 is supplied to the shift register 1.

Thus, for each input sample data x(n), a corresponding set of sign bit, index, and bit shift values is stored in the shift register 1.

At the outputs of the shift register 1, corresponding delayed sign bit, index and bit shift values are provided for each of the sample data values x(n) to x(n−4). The delayed sign bit, index, and bit shift values are supplied to corresponding reduced coefficient tables 210 to 215 from which the data of the corresponding filter coefficient $b_0$ to $b_4$ are output in accordance with the supplied index value. The output data of the reduced coefficient tables 210 to 215 and the corresponding sign bit and bit shift values are supplied to corresponding bit shifting units 220 to 225 in which a bit shifting operation and sign bit check or set is performed in accordance with the supplied sign bit and bit shift values.

Thus, final weighted sample data corresponding to a multiplication of the respective input sample data x(n−i) with the respective filter coefficient $b_i$ are obtained at the outputs of the bit shifting units 220 to 225. The final weighted sample data are then supplied to the adder 3 shown in FIG. 1.

It is to be noted that, according to FIG. 2, only those reduced coefficient tables have to be provided, which cannot be replaced by a reduced coefficient table of another coefficient and a subsequent bit shifting operation. The required additional bit shifting operation may then also be performed in the respective one of the bit shifting units 220 to 225.

In general, the advantage of the digital filter according to the present invention increases with a growing number of filter coefficients and bits of the input sample data. Thus, large digital filters can be implemented in FPGAS, which is not possible with the initially described DA architecture. Moreover, since no shifting operations are required after the multiplications, no additional latency is introduced. Thus, large FIR filters can be implemented as FPGAs in feedback systems.

Additionally, FIR filters in transposed directform, wherein only two input values are added at a time and not all results of the multiplications are added together simultaneously, can be implemented with the architecture of the FIR filter according to the present invention. Even in case of very long filters, this architecture will not introduce any latency, since the adders can be kept very small, i.e. only two values have to be added at a time.

It is to be noted, that the digital filter and multiplication method described in the preferred embodiment can also be applied to IIR filters and other digital processing means using a LUT based multiplication. In general, the multiplication is based on a look-up table, wherein those multiplication results, which correspond to a multiplier or multiplicand value which can be obtained by multiplying another multiplier or multiplicand value by a factor equal to two or a power of two, are obtained by using the multiplication result corresponding to said another multiplier or multiplicand value and performing a corresponding bit shifting operation in accordance with said factor, and wherein only those multiplication results are stored in look-up tables, which cannot be generated from another multiplication result by said bit shifting operation.

The above description of the preferred embodiment and the accompanying drawings are only intended to illustrate the present invention. The preferred embodiment of the invention may therefore vary within the scope of the attached claims.

In summary, a digital filter and a multiplication method are described, which lead to an efficient architecture for a hardware implementation of digital FIR and IIR filters into FPGAs. The multiplications of input sample data and delayed sample data with filter coefficients are performed by addressing look-up tables in which corresponding multiplication results are pre-stored. The size of the look-up tables is reduced by storing only those multiplication results which cannot be obtained by a shifting operation performed on the other pre-stored multiplication results, the input sample data, or the delayed sample data. Thereby, the size of the look-up tables can be compressed significantly such that an implementation of large digital filters into FPGAs is possible.

What is claimed is:

1. A digital filter comprising:

a) delay means for delaying input sample data by predetermined delay periods to generate delayed input sample data;

b) look-up table means for pre-storing weighted sample data corresponding to multiplications of input sample data with predetermined filter coefficients, wherein said input sample data and said delayed input sample data are used for addressing said look-up table means; and c) bit shifting means for generating other weighted sample data corresponding to other multiplications of input sample data with predetermined filter coefficients by performing a bit shifting operation using said pre-stored weighted coefficients, wherein the values of said other weighted sample data correspond to the values of said pre-stored weighted sample data multiplied by two or a power of two, wherein said other weighted sample data correspond to input sample data the value of which can be obtained by multiplying another input sample data by a factor equal to two or a power of two, and are generated by using a corresponding one of said pre-stored weighted sample data relating to said other input sample data and performing a corresponding bit shifting operation in accordance with said multiplication factor, and wherein said pre-stored weighted sample data are stored in look-up tables each corresponding to one filter coefficient, and wherein said digital filter comprises an index table for addressing said another sample data, and a zero pad table indicating the number of bit shifting operations to be performed using said corresponding one of said pre-stored weighted sample data relating to said other sample data.

2. A digital filter according to claim 1, wherein said bit shifting means is arranged to generate weighted sample data by performing a bit shifting operation using said input sample data or said delayed input sample data.

3. A digital filter according to claim 1, wherein said other multiplications correspond to a filter coefficient the value of which can be obtained by multiplying another filter coefficient by a factor equal to two or a power of two, and wherein said bit shifting operation is performed in accordance with said multiplication factor by using a corresponding one of said pre-stored weighted sample data relating to said another filter coefficient.

4. A digital filter according to claim 3, wherein said pre-stored weighted sample data are stored in look-up tables each corresponding to one filter coefficient.

5. A digital filter according to claim 1, wherein said look-up table means comprises ROM tables for storing said pre-stored weighted sample data.

6. A digital filter according to claim 1, wherein said digital filter is implemented as an FPGA.

7. A method for performing digital filtering of input sample data, comprising the steps of:

a) delaying said input sample data by predetermined delay periods to generate delayed input sample data;

b) pre-storing weighted sample data corresponding multiplications of input sample data with predetermined filter coefficients;

c) generating other weighted input data corresponding to other multiplications of input sample data with predetermined filter coefficients by performing a bit shifting operation using said pre-stored weighted sample data, wherein the values of said other weighted sample data correspond to the values of said pre-stored weighted sample data multiplied by two or a power of two, wherein said other weighted sample data correspond to an input sample data, the value of which can be obtained by multiplying another input sample data by a factor equal to two or a power of two, and are generated by using a corresponding one of said pre-stored weighted sample data relating to said other input sample data and performing a corresponding bit shifting operation in accordance with said multiplication factor, and further comprising the step of storing said prestored weighted sample data in look-up tables each corresponding to one filter coefficient, and providing an index table addressing said other input sample data, and a zero pad table indicating the number of bit shifting operations to be performed on said corresponding one of said pre-stored weighted sample data relating to said other input sample data.

8. A method according to claim 7, further comprising the step of generating weighted sample data by performing a bit shifting operation using said input sample data or said delayed input sample data.

9. A method according to claim 7, wherein said other weighted sample data correspond to a filter coefficient the value of which can be obtained by multiplying another filter coefficient by a factor equal to two or a power of two, and are generated by using a corresponding one of said pre-stored weighted sample data relating to said another filter coefficient and performing a corresponding bit shifting operation in accordance with said multiplication factor.

10. A method according to claim 9, further comprising the step of storing said prestored weighted sample data in look-up tables each corresponding to one filter coefficient.

11. A method for performing a multiplication based on a look-up table, comprising the steps of:

a) obtaining those multiplication results, which correspond to a multiplier or multiplicand value which can be obtained by a multiplying another multiplier or multiplicand value by a factor equal to two or a power of two, by using the multiplication result corresponding to said another multiplier or multiplicand value and performing a corresponding a bit shifting operation in accordance with said factor; and b) storing only those multiplication results which cannot be generated from another multiplication result by said bit shifting operation, further comprising the step of storing said multiplication results in look-up tables each corresponding to a single predetermined multiplier, and providing an index table addressing said another multiplicand, and a zero pad table indicating the number of bit shifting operations to be performed on said multiplication results corresponding to said another multiplicand.

* * * * *